United States Patent [19]

Houser

[11] Patent Number: 4,631,821
[45] Date of Patent: Dec. 30, 1986

[54] METHOD FOR JOINING METAL COMPONENTS TO A SUBSTRATE

[75] Inventor: David E. Houser, Apalachin, N.Y.

[73] Assignee: International Business Machines Corporation, Armonk, N.Y.

[21] Appl. No.: 565,959

[22] Filed: Dec. 27, 1983

Related U.S. Application Data

[63] Continuation-in-part of Ser. No. 458,375, Jan. 17, 1983, abandoned, which is a continuation of Ser. No. 223,190, Jan. 7, 1981, abandoned.

[51] Int. Cl.[4] .............................................. H05K 3/00
[52] U.S. Cl. .................................... 29/845; 29/421 E; 29/739; 174/68.5; 339/220 R
[58] Field of Search ................ 29/845, 878, 838, 876, 29/747, 421 E, 720, 739, 854, 844; 179/68.5; 339/220 T, 220 R

[56] References Cited

U.S. PATENT DOCUMENTS

| | | | |
|---|---|---|---|
| 3,257,708 | 6/1966 | Stricker | 29/845 |
| 3,484,937 | 12/1969 | Campbell, Jr. et al. | 29/845 |
| 3,489,879 | 1/1970 | Salzer | 29/878 X |
| 3,494,029 | 2/1970 | Theilgaard | 29/747 X |
| 3,768,134 | 10/1973 | Reda et al. | 29/720 X |
| 4,110,904 | 9/1978 | Johnson | 29/838 X |

FOREIGN PATENT DOCUMENTS 891180 1/1972 Canada .

OTHER PUBLICATIONS

IBM Tech. Discl. Bull., vol. 9, No. 4, Sep. 1966, p. 365, by Byrnes.

*Primary Examiner*—Howard N. Goldberg
*Assistant Examiner*—Carl J. Arbes
*Attorney, Agent, or Firm*—Manny W. Schecter; M. J. Kenemore; J. L. Abzug

[57] ABSTRACT

A method for fixing a pin to a ceramic substrate includes inserting the pin into a hole through the thickness of the substrate, restraining one end of the pin that extends from one surface of the substrate, and striking the end of the pin at the opposite end of the substrate with a force sufficient to form a head on the pin and to cause permanent radial expansion of the pin against the surface of the hole in the substrate.

3 Claims, 7 Drawing Figures

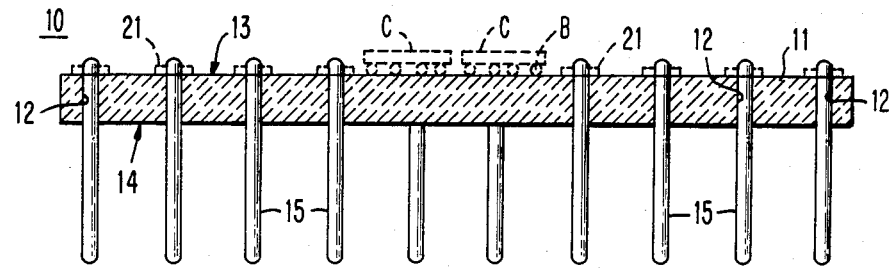
FIG. 1
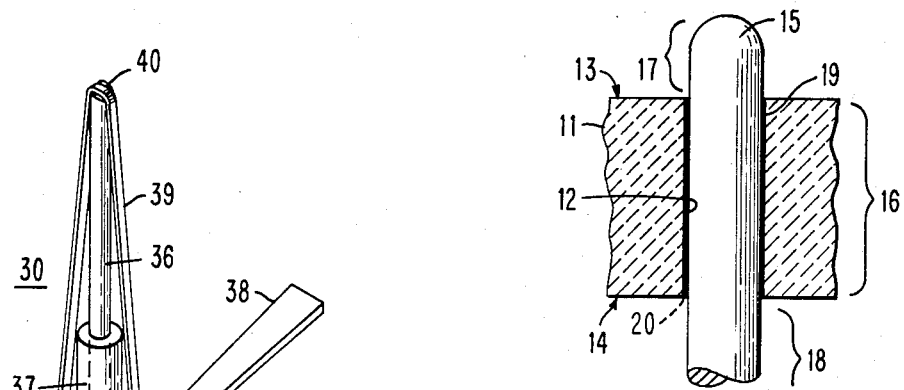
FIG. 1A
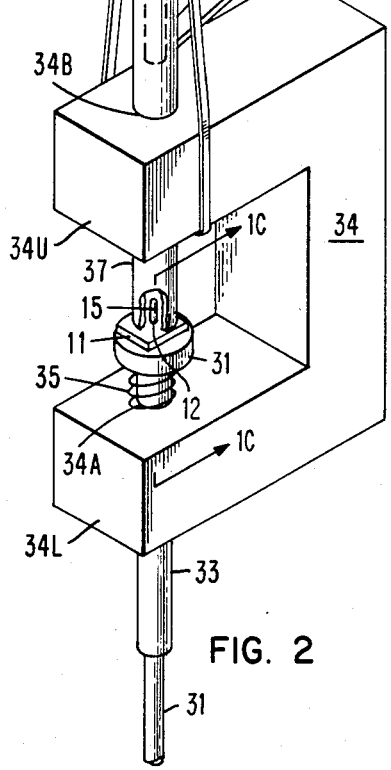
FIG. 2
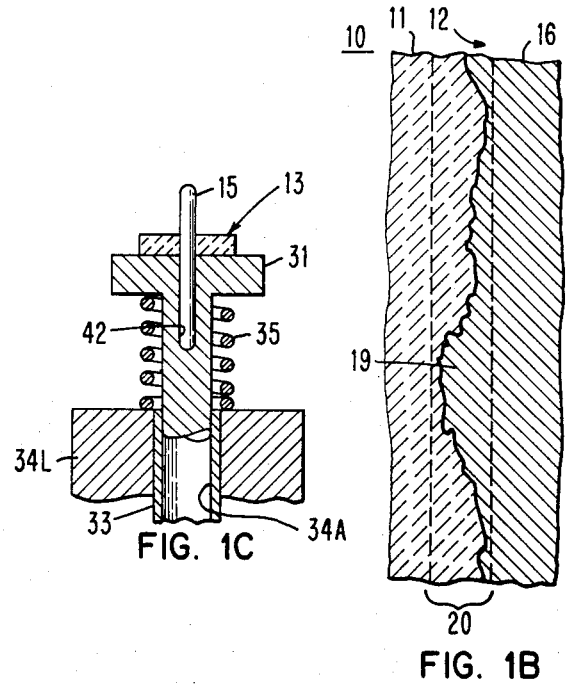
FIG. 1C
FIG. 1B

METHOD FOR JOINING METAL COMPONENTS TO A SUBSTRATE

This application is a continuation-in-part of application Ser. No. 458,375, filed 1/17/83 which is a continuation of application Ser. No. 223,190, filed 1/7/81, now abandoned.

BACKGROUND OF THE INVENTION

1. Field of the Invention

This invention relates to the field of electronic packaging, and more patricularly pertains to the process of fixing metal pins to a brittle substrate.

2. Description of the Prior Art

Integrated microelectronic circuit chips are frequently mounted on ceramic substrates that provide planar surfaces on which electrical lines are formed for interconnecting the input and output terminals of the chips and other portions of the electronic system of which they are a part. Connections are made between the various circuits with which the chips interface by copper pins, which are electrically connected to the terminals of the chips and are mechanically attached and held in position after being fixed to the ceramic substrate. Unfortunately, ceramics are brittle, frangible materials that are easily shattered when large forces, particularly abrupt tension forces, are applied in the process of fixing the pins to the substrate. In the process of joining the pin and substrate, large tensile forces necessarily result in the vicinity of the holes that are formed through the ceramic into which the pins are inserted. Therefore, it is conventional practice in the process of fixing the connecting pins to the ceramic substrate that the force which attaches the pin and forms the pin head be slowly applied and of minimum magnitude so that damage to the ceramic is avoided.

U.S. Pat. No. 3,484,937 describes a method for connecting a pin to a printed circuit board in which a hole is drilled through the thickness of the board, made of fiberglass impregnated cloth having a high tension strength and one particularly tolerant of impact force applied in the process of pinning. The pin is inserted in a hole whose diameter is slightly larger than the diameter of the pin. The ends of the pin blank are restrained to limit radial expansion while the pin is longitudinally compressed. This causes an expansion of its center portion radially outward into engagement with the surface of the hole. The extent of the compression and radial expansion of the pin depends on the particular board material being used and is such that the mechanical connection has strength adequate to assure proper retention of the pin in the hole.

Ceramic substrates are rigid and brittle materials. They fail easily by cracking along lines that run between pin holes drilled through the thickness of the material when high forces are applied to the copper pin the the process of fixing the pins to the printed circuit board. A method for fixing pins in a substrate whose holes are somewhat smaller than the pins so as to establish an interference or press fit between the pins and the holes is described in U.S. Pat. No. 3,566,464. This system is not suitable for pinning substrates of ceramic material because the end of the pin that pushes against the rim of the substrate surrounding the small diameter hole produces a force that can readily crack and damage a ceramic substrate.

Other pinning systems, particularly those in which the pins are driven at high speed to form an opening either partially or completely through the body of the substrate, are unsuitable for pinning ceramic substrates because the striking force and propelled pins produce tension forces which can easily damage or fail the body of the ceramic substrate. A high velocity pinning system of this kind is described in Canadian Pat. No. 891,180 and in the publication by H. P. Byrne, Terminal pin projector, IBM Technical Disclosure Bulletin, volume 9, number 4 (1966) page 365.

A conventional method, known as the head and bulge system, is frequently used to pin ceramic substrates. According to this method, a pin blank is inserted in a larger diameter hole formed in the substrate so that the pin extends outward on each side of the substrate. A head is formed on one side of the substrate and a bulge is formed on the pin at the opposite end. The substrate material that surrounds the hole located between the head and the bulge becomes tightly wedged between them and in this way secures the pin to the substrate. Examples of systems that employ the head and bulge method of securing pins to the substrate are described in U.S. Pat. Nos. 3,216,097; 3,257,708 and 3,768,134. These systems are not satisfactory for fixing pins to a ceramic substrate because the slowly applied force required to form the bulge and head is so large that it often causes the ceramic to fail in the region between the pin holes.

U.S. Pat. No. 3,735,466 describes a machine for connecting pins to a ceramic substrate that employs multiple individual bushings attached to a flexible pad which provides an elastic foundation of known spring constant. A heading ram is lowered into contact with the pins to form heads but the substrate is in direct contact with the flexible bushings which move parallel to the applied force and conform to the surface of the substrate, thereby supporting the substrate and reducing the magnitude of bending moments in the substrate that otherwise would cause cracking. A similar method described in the publication by R. J. Modlo et al, Low-stress pin insertion, IBM Technical Disclosure Bulletin, volume 22, number 8B, (January 1980) pages 3649–3650, eliminates bending stresses in the ceramic substrate and reduces the occurrence of cracking of the substrate by employing segmented floating rams and anvils that provide an equal load to each loading point. An equal reaction force is located directly opposite the load point in order to assure that the load applied to fix the pin to the substrate is equal at each ram. A flexible bladder is filled with an incompressible fluid and contacts the top of each pinning ram. Similarly the anvils are supported on a single fluid-filled bladder beneath the substrate.

All of the prior art systems tend to produce an undesirable space or void between the substrate hole and the pin. This void weakens the effectiveness of the interconnection between the pin and the substrate and becomes a repository for undesirable contaminants, which can adversely affect the mechanical connection between the pin and substrate and the electrical conduction properties of the pin.

SUMMARY OF THE INVENTION

The method according to this invention is suitable for use in forming a mechanical connection between a pin, preferably an unheaded copper pin, and a substrate in which a hole has been formed to receive the pin, the substrate preferably being made of a ceramic material such as alumina. The hole formed in the substrate must be large enough to receive the pin, yet has a diameter that fits close to the pin before the pin is upset and fixed to the substrate. The length of the pin should extend entirely through the thickness of the substrate and provide a portion that extends from one surface of the substrate and another portion that extends from the opposite side of the substrate. The length of the second portion should be such that a head having a larger diameter than that of the pin can be formed by applying an abrupt impact force to the end of the pin. An anvil having a predetermined mass, which may be supported resiliently, is fitted over the end of the first portion of the pin. The diameter of the hole in the anvil must be large enough to receive the pin, yet be small enough to support the pin transversely to its axis against the tendency of the pin to buckle due to the impact load. The hole in the anvil has a bottom surface that engages the end of the pin and on which a reaction force, opposite to that of the striking force, is applied.

A frame aligns the axis of the anvil, the axis of the pin and the axis of a guide member in which a spring-loaded hammer is free to move from a position of high potential energy into contact with the upper surface of the pin. A portion of the energy stored in the hammer is converted to mechanical energy that upsets the end of the pin with which the hammer makes contact and on which the pin head is formed. The opposite end of the pin is restrained in the anvil by the inertia of the anvil, which is accelerated from the rest by the effect of the impact force applied to the pin end. The axial restraint provided by the anvil reacts the impact force causing compressive stresses and strains to be developed within the pin. The stress produced by impact in the pin exceeds the elastic limit of the pin material causing permanent, plastic radial expansion of the pin into intimate contact with the irregular surface of the hole formed in the ceramic substrate. Yet when the hammer velocity at impact is high the ceramic substrate will not fracture despite the characteristic brittle nature of its material.

DESCRIPTION OF THE DRAWINGS

The foregoing features and advantages of the invention will be apparent from the following more particular description of the preferred embodiment of the invention illustrated in the accompanying drawings.

FIG. 1 is a cross section through the centerline of a row of pins inserted through the thickness of a substrate.

FIG. 1A is an enlarged partial cross sectional view of the assembly of FIG. 1 illustrating a pin located in an opening of the substrate.

FIG. 1B is an enlarged partial cross sectional view of the pin and substrate of FIG. 1A illustrating in greater detail the interlocking engaged relationship.

FIG. 1C is a cross section taken at plane 1C—1C of FIG. 2.

FIG. 2 is a schematic perspective view of a machine used to pin a ceramic substrate in accordance with principles of this invention.

DESCRIPTION OF THE PREFERRED EMBODIMENT

Figure 4:
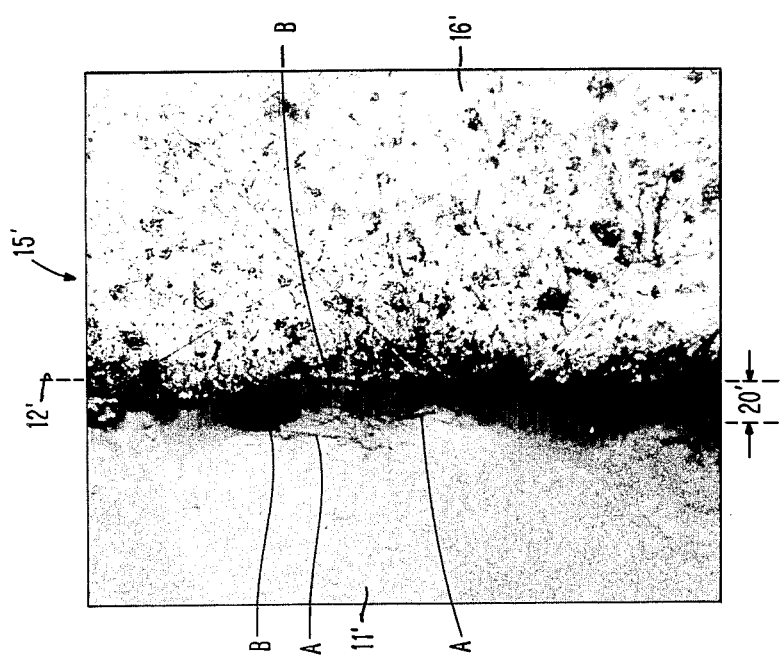
FIG. 4 is a microphotograph of a portion of a ceramic substrate that is pinned using the head and bulge method.
Figure 3:
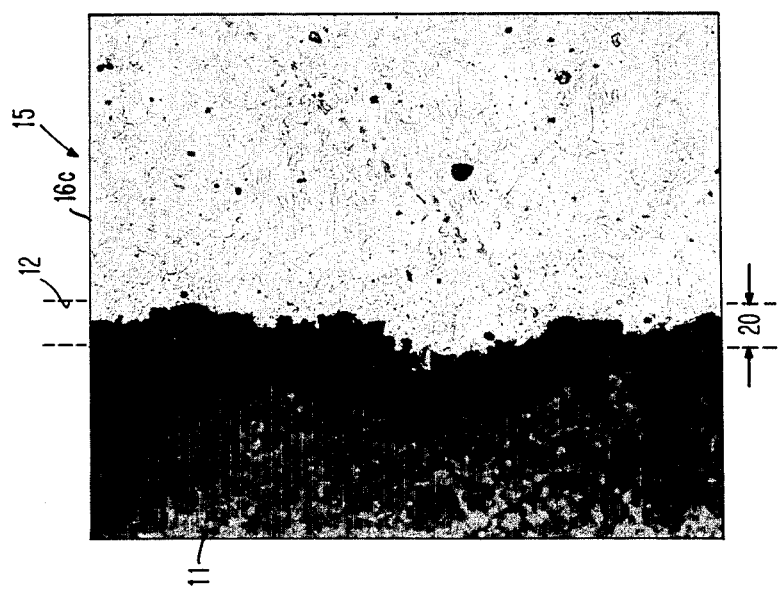
FIG. 3 is a microphotograph of a portion of a ceramic substrate pinned in accordance with the principles of this invention.

A substrate-pin assembly, whose general arrangement is shown in FIG. 1 and whose details are illustrated in FIGS. 1A and 1B, includes a ceramic substrate 11, which has multiple holes formed through its thickness. Located on the upper surface 13 of the substrate is a metallic layer forming circuit lines, conductors, bonding pads and lands. One or more integrated circuit devices or chips C are adapted for mounting by way of their input and output terminals to the bonding pads at multiple connections B. FIG. 1 shows schematically that the connections are in the form of solder balls, which after heating create a fusible electrically conductive connection between the chips and the metallic layer.

Assembly 10 further includes multiple electrically conductive pins 15, preferably of copper, located within the holes 12 and extending outwardly beyond planar surfaces 13 and 14. Each pin has an intermediate portion 16 located within the hole, a short upper portion 17 extending slightly above the surface 13, and a longer portion 18 extending below surface 14 and adapted to be received in a suitable female receptacle. Upper portion 17 is adapted to be connected by solder or other joining means to the circuit lands on surface 13. The circuit lines are arranged in a fan out array that originates at the bonding pads located on the chip bonding site at the center of the substrate and terminate at the circuit lands located at the periphery of the substrate adjacent the pins 15.

Referring now to FIG. 2, a machine for fixing a pin to a ceramic substrate includes a U-shaped frame 34. Each leg of the frame has a bore 34A, 34B that is aligned with the bore of the other leg. A lower member 33 extending through bore 34A is used to guide an anvil 31, which may be biased upward by a compression spring 35 located between the frame and a head formed integrally with the anvil. The anvil can move readily within lower member 33.

The upper leg of frame 34 supports a guide member 37, which is fitted within bore 34B and has an upper portion that extends above the upper surface of leg 34U, and a lower portion that extends below the lower surface of the leg. Guide 37 is formed with a central cylindrical bore into which is fitted a hammer 36 adapted to move along the bore between its position shown in FIG. 2 and the upper surface of the pin shown extending above the upper surface of substrate 11. The axes of guide 37 and of hammer 36 are aligned with the axis of the lower member 33; pin 15 is aligned with this common axis. The lower end of the hammer 36, therefore, contacts the upper surface of pin 15 as the hammer moves downward within the bore of guide 37.

An elastic band 39 is wrapped around the upper leg of the frame and engages the end 40 of hammer 36 when the elements of the machine are positioned as shown in FIG. 2. In this position, a stop or trigger member 38 holds the hammer upward against the effect of gravity and the tensile force of the elastic band. When trigger 38 is removed, the band contracts and hammer 36 moves within the bore of guide 37 striking the upper end of pin 15. A portion of the energy of the hammer is converted to mechanical strain energy, which deforms or upsets the upper portion 17 of the pin, thereby forming the head 21 which expands radially outward and into contact with the upper surface 13 of the substrate.

Another portion of the enegry of the hammer accelerates the anvil head, substrate and pin causing these to move downward. Although spring 35 need not be employed, when compression spring 35 is used, it stores the energy remaining in the hammer, anvil, substrate and pin after impact. The bore 42 formed in the anvil head provides axial and radial restraint to the portion of the pin that is fitted within that bore. Compressive stress greater than the compression elastic limit of the pin material can be developed in the pin when the hammer impacts the end of the pin. When the compression stress in the pin exceeds the compression elastic limit stress of the pin material, the diameter of the pin permanently increases due to the plastic radial deformation caused by the striking force and the anvil in which the pin is restrained. As a result of the plastic deformation of the pin, the diameter of that portion of the pin that is surrounded by the ceramic substrate grows radially outward into contact with the surface of the hole 12, which partially restrains the plastic deformation of the pin. FIG. 1B shows that after the hammer strikes the end of the pin the outer surface of the pin will conform closely to the irregular contour of the surface of the hole formed in the ceramic substrate; provided the compressive elastic limit stress of the pin material is exceeded by the compression stress in the pin.

This method is employed successfully using pins formed of a copper alloy that includes 1% zirconium and 99% oxygen-free copper, an alloy known as Amzirc sold by GTE Corporation, and a ceramic substrate made from 100% alumina. The pinning technique according to this invention is used to fix pins made of Amzirc to alumina substrates using pins having a nominal diameter of 0.020 inches and diametrical tolerances of +0.0003 and −0.0002 inches. The hole formed in the ceramic by drilling or other similar means preferably has a diameter that does not exceed 0.024 inches and is not less than 0.022 inches. The thickness of the ceramic substrate through which the hole is made is nominally 0.060 inches and the corresponding diametric plus and the minus tolerances are approximately 0.001 inches. The ultimate tensile strength of the alumina is approximately 35,000 pounds per square inch and its compressive strength is in the range 88–90,000 pounds per square inch.

The initial force in the elastic band, when it is extended to the position shown in FIG. 2 is 1.6 pounds and the force in the band at the point of impact is 0.8 pounds. The weight of the hammer is 0.00205 pounds and the distance the hammer travels from the position of maximum extension of the elastic band to the point of impact on the upper surface of the pin is 1.25 inches. Therefore, the energy stored in the stretched band and transferred to the hammer with respect to the end of the pin is approximately 1.50 inch-pounds. The mass of the anvil is 0.0231 pounds.

From these values it has been determined that the velocity of the hammer at the point of impact is approximately 752 inches per second. The length of portion 17 of the pin is approximately 0.060 inches and the length of portion 18 is approximately 0.150 inches.

An alternate method for practicing the invention eliminates the need for the anvil to be accelerated by the effect of the impact force. In this case, spring 35 is eliminated and the lower surface of anvil head rests on the upper surface of the lower leg 34L of the frame member before impact. By selectively choosing the energy of the hammer and its velocity at impact, the amount of energy that is converted to strain energy to expand the diameter of the pin in the region 16 can be controlled to avoid failure of the ceramic in the vicinity of hole 12.

Another example of the use of this method to fix a pin made of this copper alloy to an alumina ceramic substrate has been demonstrated with the pin and substrate having the dimensions and tolerances previously mentioned. In this case, however, the mass of the hammer is $1.085 \times 10^{-4}$ pounds and the mass of the anvil is maintained at 0.0231 pounds. The velocity of the hammer at the time of impact is approximately 3141 inches per second, and the magnitude of energy in the hammer prior to striking the end of the pin is 1.39 inch-pounds. The hammer is accelerated by connecting a source of compressed air above the end 40 of the hammer in a cylindder whose axis is aligned with that of guide 37. Elastic band 39 is not used in this instance. This example demonstrates that the mass of the hammer can be experimentally changed to produce a hammer velocity at impact that avoids failure of the ceramic.

Although the invention has been shown and described with reference to the preferred embodiment, it will be understood by those skilled in the art that there are changes in the mass of the hammer and of the anvil, the magnitude of energy stored in the means that accelerates the hammer before release of the trigger, the travel distance of the hammer, the dimensions and tolerances of the pin and substrate and the materials involved can be changed without departing from the spirit and scope of the invention.

What is claimed is:

1. A method for connecting a metal pin and a ceramic substrate comprising:
    forming a hole in a ceramic substrate large enough to receive the pin therein;
    inserting a pin in the hole so that a first portion of the pin extends outwrad from one side of the substrate and a second portion of the pin extends outward from another side of the substrate;
    restricting the axial movement of the pin by applying to the first portion of the pin restricting means for impeding the movement;
    resiliently supporting an anvil member in contact with the end of the first portion of the pin;
    adapting the resilient support to resist axial movement of the anvil member and pin due to the effect of a striking force;
    locating a hammer adjacent the end of the second portion of the pin;
    providing a fixed amount of energy to the hammer to be applied to the end of the second portion of the pin; and
    striking the end of the second portion of the pin with the hammer to produce a compressive stress in the pin exceeding the compression elastic limit of the pin and a tensile stress in the substrate less than the tensile strength of the sustrate, thereby causing permanent radial expansion of the pin against the surface of the hole in the substrate.

2. A method for connecting a metal pin and a ceramic substrate comprising:
    forming a hole in a ceramic substrate large enough to receive the pin therein;
    inserting a pin in the hole so that only a first portion of the pin extends outward from one side of the substrate and a second portion of the pin extends outwrd from another sie of the substrate;

restricting axial movement of the pin by applying to the first portion of the pin restricting means for impeding the movement;

locating a hammer adjacent the end of the second portion of the pin;

aligning the hammer for movement toward the end of the second portion of the pin;

connecting a stretched elastic band to the hammer, thereby resiliently biasing the hammer toward the end of the second portion of the pin; and allowing the hammer to strike the second portion of the pin to produce a compressive stress in the pin exceeding the compression elastic limit of the pin and a tensile stress in the substrate less than the tensile strength of the substrate, thereby causing permanent radial expansion of the pin against the surface of the hole in the substrate.

3. The method of claim 2 wherein the first portion of the pin is unflanged.

* * * * *